(12) United States Patent
Motwani

(10) Patent No.: US 9,946,598 B1
(45) Date of Patent: Apr. 17, 2018

(54) HANDLING OPEN CIRCUITS WHILE WRITING DATA BY MOVING THEM TO THE LEAST VULNERABLE LOCATION IN AN ERROR CORRECTION CODE CODEWORD

(71) Applicant: Intel Corporation, Santa Clara, CA (US)

(72) Inventor: Ravi H. Motwani, San Diego, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/282,640

(22) Filed: Sep. 30, 2016

(51) Int. Cl.
*G11C 29/00* (2006.01)
*G06F 11/10* (2006.01)
*G11C 29/52* (2006.01)
*H03M 13/00* (2006.01)

(52) U.S. Cl.
CPC .......... *G06F 11/1068* (2013.01); *G11C 29/52* (2013.01); *H03M 13/005* (2013.01)

(58) Field of Classification Search
CPC ... G06F 11/1068; G11C 29/52; H03M 13/005
See application file for complete search history.

(56) References Cited

U.S. PATENT DOCUMENTS

2014/0117491 A1* 5/2014 Wu ..................... H01L 23/5256
257/506
2014/0298129 A1* 10/2014 Wu ..................... H03M 13/116
714/752

* cited by examiner

*Primary Examiner* — Sam Rizk
(74) *Attorney, Agent, or Firm* — Jordan IP Law, LLC

(57) ABSTRACT

Systems, apparatuses and methods may provide for recording, if a non-volatile memory (NVM) location satisfies an open circuit condition, open circuit location information associated with the NVM location. Additionally, a shift of one or more bits may be conducting during a write of a codeword to the NVM location to avoid open circuit in the NVM location. Moreover, an end of a parity portion of the codeword may be punctured by an amount of the shift. In one example, the end of the parity portion includes a last circulant of the codeword.

25 Claims, 3 Drawing Sheets

HANDLING OPEN CIRCUITS WHILE WRITING DATA BY MOVING THEM TO THE LEAST VULNERABLE LOCATION IN AN ERROR CORRECTION CODE CODEWORD

TECHNICAL FIELD

Embodiments generally relate to memory structures.

BACKGROUND

Defects in the form of open lines/circuits or shorts may be prevalent in NAND flash memory and other types of non-volatile memory (NVM). Using conventional techniques to handle open circuits while writing to NVM may increase the raw bit error rate (RBER). While handling open circuits during read operations may reduce the RBER, such solutions may involve complex circuitry and mechanisms that have a negative impact on performance.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
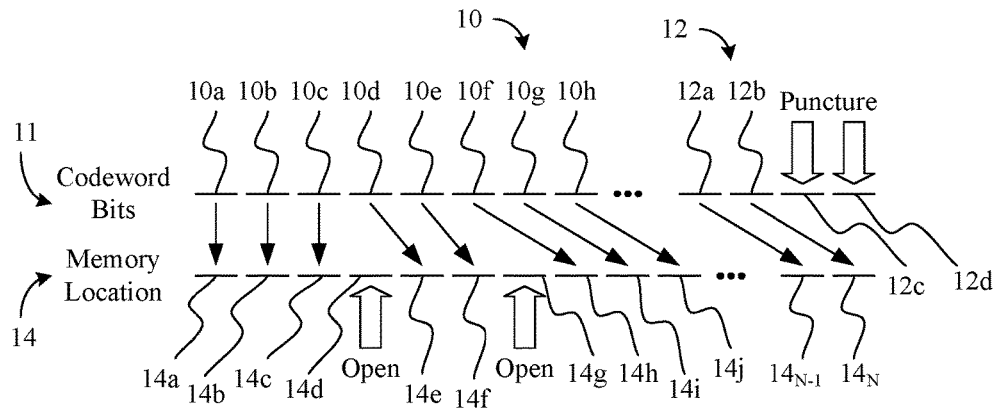
FIG. 1 is an illustration of an example of a shift of codeword bits to avoid open circuits according to an embodiment.

Turning now to FIG. 1, a codeword 11 is shown, wherein the codeword 11 generally includes a message portion 10 (10a-10h) and a parity portion 12 (12a-12d). The codeword 11 may be stored to a memory location 14 (e.g., non-volatile memory/NVM location such as, for example, a NAND flash memory address) in conjunction with one or more input/output (IO) communications (e.g., wired, wireless), computational processes, and so forth. Thus, the message portion 10 might represent data, instructions or other information (e.g., payload), whereas the parity portion 12 may enable a recipient of the codeword 11 to determine whether an error has occurred during the transmission of the codeword 11 from one physical location to another. In one example, the parity portion 12 is structured according to an error correction code (ECC) such as, for example, a low density parity check (LDPC) code. Thus, each bit in the parity portion 12 may correspond to a parity check equation that is a function of one or more bits in the message portion 10. Bits in the message portion 10 that do not satisfy one or more parity check equations may be considered to be "bad" bits.

As will be discussed in greater detail, when writing the codeword 11 to the memory location 14, bits of the codeword 11 may be shifted (e.g., "pushed") to avoid open circuits (e.g., "opens") in the memory location 14. For example, the value of a first bit 10a of the codeword 11 may be stored to a first bit line 14a of the memory location 14, the value of a second bit 10b of the codeword 11 may be stored to a second bit line 14b of the memory location 14, and the value of a third bit 10c of the codeword 11 may be stored to a third bit line 14c of the memory location 14. If, however, the memory location 14 satisfies an open circuit condition such as, for example, a threshold number of open circuits (e.g., fifty) being exceeded, a shift of the bits of the codeword 11 may be conducted in order to avoid the open circuits. Thus, if an open circuit is detected with respect to a fourth bit line 14d of the memory location 14, the value of a fourth bit 10d of the codeword 11 may be stored to a fifth bit line 14e of the memory location 14 instead of the defective fourth bit line 14d. The write operation may proceed by storing a fifth bit 10e to a sixth bit line 14f of the memory location 14. In the illustrated example, the shift is repeated to avoid an open circuit with respect to a seventh bit line 14g of the memory location.

Moreover, the end of the parity portion 12 may be punctured by the amount of the shift, wherein the punctured bits may be considered erased from the perspective of subsequent read/decoding operations. In coding theory, puncturing may be the process of removing some of the parity bits after encoding with an ECC. For example, a third bit 12c and a fourth bit 12d of the codeword 11 might be punctured to account for the loss of two bits in the memory location 14. The bit values used herein are to facilitate discussion only and may vary depending on the circumstances.

Puncturing the end of the parity portion 12 may provide a number of advantages. More particularly, the end of an LDPC code may correspond to lower column weights (e.g., the number of ones in the column of a parity check matrix), which implies that an erasure may impact fewer parity check equations. Additionally, restricting the number of opens to the last circulant may imply that an open circuit impacts at most one bit in a check equation. A circulant as referenced herein may be considered a mathematical determinant in which each row is derived from the preceding row by cyclic permutation, with each constituent being pushed into the next column and the last into the first so that constituents of the principal diagonal are all the same. Thus, open circuits may accumulate in the least vulnerable last circulant rather than being scattered. Such an approach may give rise to further raw bit error rate (RBER) gains (e.g., compared to a case in which the opens are spread randomly). Indeed, 2× or more RBER benefits may be achieved via the technology described herein.

Figure 2:
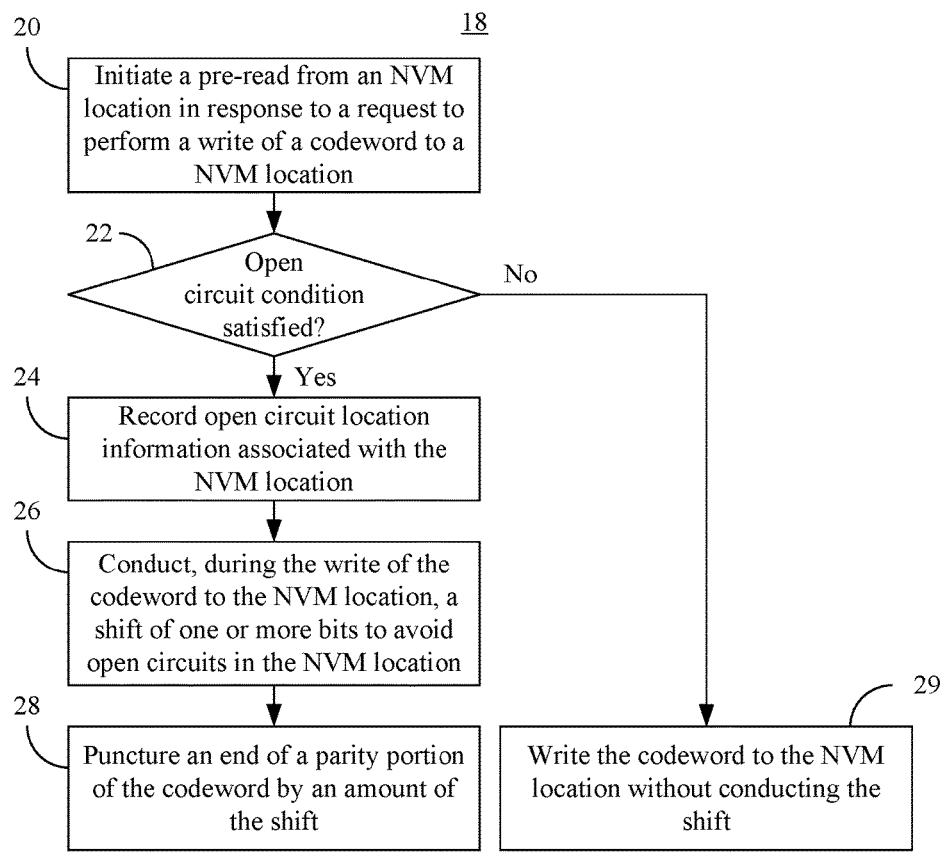
FIG. 2 is a flowchart of an example of a method of operating a defect management apparatus during a write operation according to an embodiment.

FIG. 2 shows a method 18 of operating a defect management apparatus during a write operation. The method 18 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 20 may provide for initiating a pre-read from a NVM location (e.g., a target location) in response to a request to perform a write of a codeword such as, for example, the codeword 11 (FIG. 1). The request to perform the write may originate from a local component (e.g., host processor, central processing unit/CPU, graphics processing unit/GPU) of a memory-based computing system, a remote component (e.g., server, peer device, etc.), and so forth. If the NVM is organized into sub-blocks (e.g., with each sub-block containing multiple pages), block 20 might involve reading the sub-block page containing the target location at a "$V_{high}$" potential that enables the state of the selected memory cells to be determined. A determination may be made at block 22 as to whether the NVM location satisfies an open circuit condition based on the pre-read. The open circuit condition may indicate a threshold number of opens.

If the open circuit condition is satisfied, illustrated block 24 records open circuit location information associated with the NVM location. Block 24 may include, for example, updating an address indirection table (AIT) to indicate that the page containing the NVM location is open circuit protected. Block 24 may also include storing open circuit bit locations such as, for example, identifiers of the fourth bit line 14d (FIG. 1) and the seventh bit line 14g (FIG. 1) to a defect map. Additionally, illustrated block 26 conducts, during the write of the codeword to the NVM location, a shift of one or more bits to avoid open circuits in the NVM location. Moreover, an end of a parity portion of the codeword may be punctured (e.g., removed) at block 28 by an amount of the shift. In one example, the punctured end of the parity portion includes a last circulant of the codeword. If it is determined at block 22 that the open circuit condition is not satisfied (e.g., threshold not exceeded), block 29 may write the codeword to the NVM location without conducting the shift.

Figure 3:
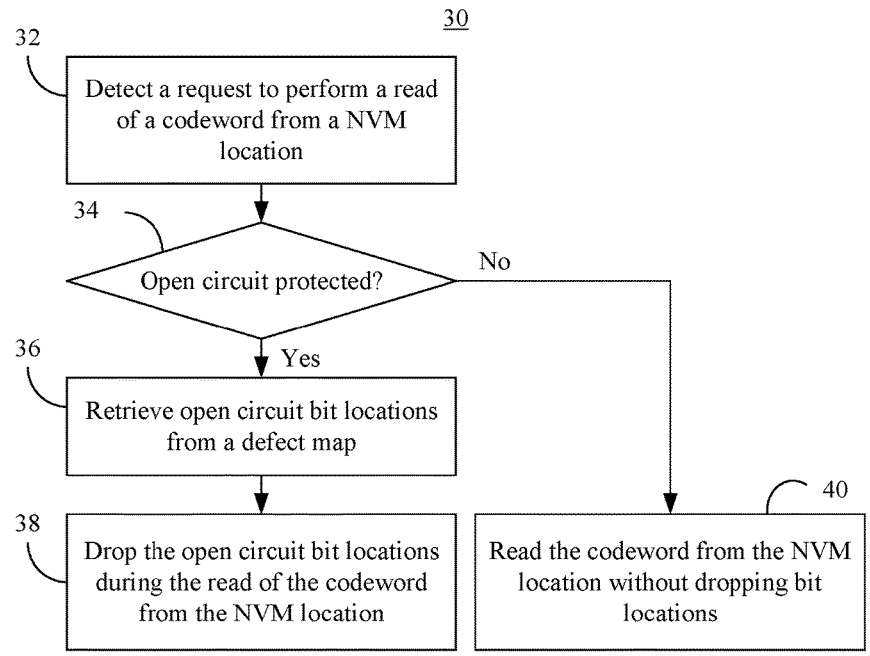
FIG. 3 is a flowchart of an example of a method of operating a defect management apparatus during a read operation according to an embodiment.

FIG. 3 shows a method 30 of operating a defect management apparatus during a read operation. The method 30 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 32 provides for detecting a request to perform a read of a codeword from a NVM location such as, for example, the memory location 14 (FIG. 1). A determination may be made at block 34 as to whether a page containing the NVM location is open circuit protected. A page of memory may be considered a fixed-length contiguous block of virtual memory, described by a single entry in a page table. Block 34 may include accessing an address indirection table. If the address indirection table indicates that the page containing the NVM location is open circuit protected, illustrated block 36 retrieves open circuit bit locations from a defect map and the open circuit bit locations are dropped (e.g., skipped, disregarded) at block 38 during the read of the codeword from the NVM location. Block 38 may include adding one or more erasures to the end of the result of the read. Adding erasures may involve flagging the impacted bits as no longer containing valid data. Accordingly, error and erasure decoding may properly handle the punctured bits. If it is determined at block 34 that the page containing the NVM location is not open circuit protected, block 40 may read the codeword from the NVM location without dropping bit locations.

Figure 4:
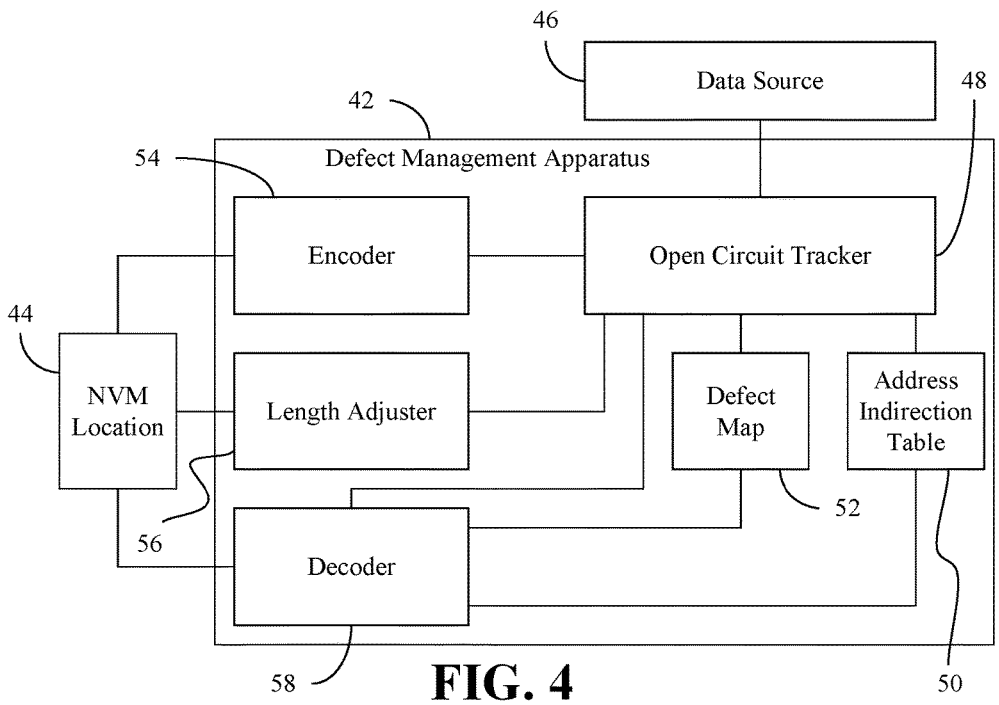
FIG. 4 is a block diagram of an example of a defect management apparatus.

FIG. 4 shows a defect management apparatus 42 that may be used to improve the operation of a memory-based computing system containing a NVM location 44. The apparatus 42, which may include logic instructions, configurable logic, fixed-functionality logic hardware, etc., or any combination thereof, may generally implement one or more aspects of the method 18 (FIG. 2) and/or the method 30 (FIG. 3). In one example, the apparatus 42 is incorporated into a memory controller that interacts with a NAND flash memory or other NVM. The apparatus 42 may receive a request to perform a write of a codeword from a data source 46 such as, for example, a CPU, host processor, GPU, server, peer device, etc. An open circuit tracker 48 may initiate a pre-read from the NVM location 44 (e.g., at $V_{high}$) in response to the request and determine whether the NVM location 44 satisfies an open circuit condition based on the pre-read. If the open circuit condition is satisfied, the open circuit tracker 48 may generally record open circuit information associated with the NVM location 44. More particularly, the open circuit tracker 48 may update an address indirection table 50 (e.g., residing in first storage such as, for example, one or more registers) to indicate that a page containing the NVM location 44 is open circuit protected. The open circuit tracker 48 may also store open circuit bit locations to a defect map 52 (e.g., residing in second storage such as, for example, another NVM location). The address indirection table 50 and the defect map 52 may reside within the apparatus 42 or elsewhere within the computing system, depending on the circumstances.

The illustrated apparatus 42 also includes an encoder 54 communicatively coupled to the open circuit tracker 48, wherein the encoder 54 conducts, during the write of the codeword to the NVM location 44, a shift of one or more bits to avoid open circuits in the NVM location 44. Thus, the encoder 54 may receive the open circuit information from the open circuit tracker 48 in determining which bits to shift. Alternatively, the encoder 54 may obtain the open circuit information directly from the defect map 52 and/or address indirection table 50. A length adjuster 56 may also be communicatively coupled to the open circuit tracker 48 and/or encoder 54, wherein the length adjuster 56 may puncture an end of a parity portion of the codeword by an amount of the shift. As already noted, the end of the parity portion may include a last circulant of the codeword, wherein a circulant may be considered a mathematical determinant in which each row is derived from the preceding row by cyclic permutation, with each constituent being pushed into the next column and the last into the first so that constituents of the principal diagonal are all the same. The length adjuster 56 may determine the puncture parameters based on information obtained from the open circuit tracker 48, the encoder 54, the defect map 52 and/or the address indirection table 50. If the NVM location 44 does not satisfy the open circuit condition, the encoder 54 may write the codeword to the NVM location 44 without conducting the shift.

The illustrated apparatus 42 also includes a decoder 58 to detect a request to perform a read of the codeword from the NVM location 44, retrieve open circuit bit locations from the defect map 52 if the address indirection table 50 indicates that the page containing the NVM location 44 is open circuit protected, and drop the open circuit bit locations during the read of the codeword from the NVM location 44. In one example, the decoder 58 adds one or more erasures to the end of the result of the read. The decoder 58 may also be used to conduct the pre-read of the NVM location 44.

Figure 5:
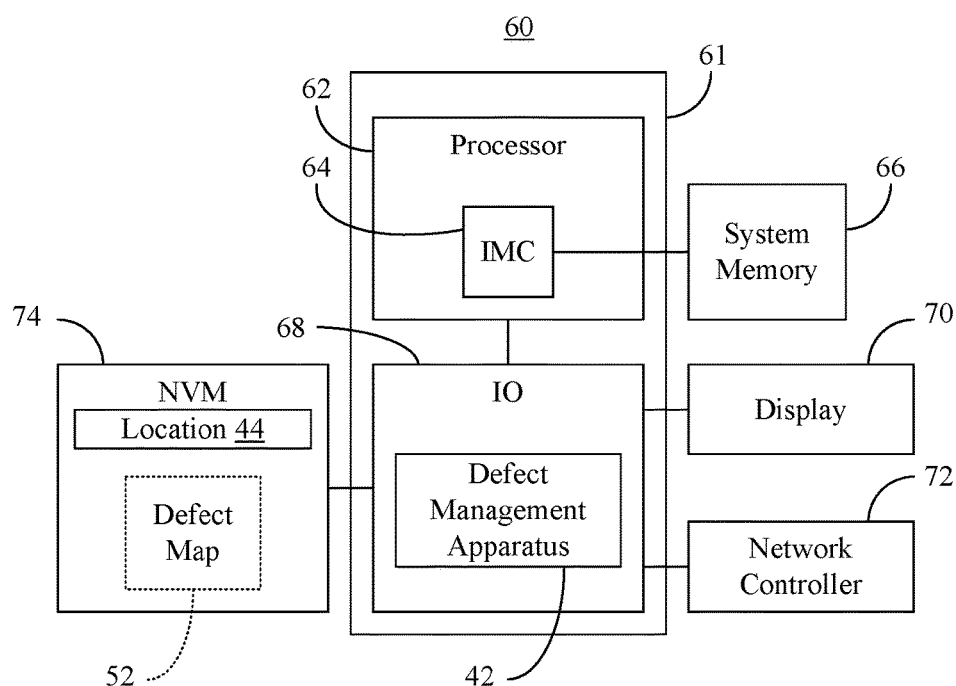
FIG. 5 is a block diagram of an example of a memory-based computing system according to an embodiment.

FIG. 5 shows a memory-based computing system 60. The system 60 may be part of a server (e.g., data center), desktop computer, notebook computer, tablet computer, convertible tablet, smart phone, wearable device, personal digital assistant (PDA), media player, etc., or any combination thereof.

The illustrated system 60 includes a processor 62 (e.g., host processor, CPU) having an integrated memory controller (IMC) 64 that communicates with system memory 66 (e.g., dynamic RAM/DRAM). Additionally, an IO module 68 may be coupled to the processor 62 and various other components such as, for example, a display 70, a network controller 72 (e.g., wireless, wired), an NVM device 74 (e.g., solid state drive/SSD, NAND flash memory device), and so forth. The IO module 68 and the processor 62 may be incorporated into a shared semiconductor die as a system on chip (SoC). In the illustrated example, the IO module 68 includes the defect management apparatus 42 and the NVM device 74 includes the NVM location 44.

Thus, the processor 62, the IO module 68 and/or another device connected to the system 60 via the network controller 72 may issue a request to write a codeword to the NVM location 44. In such a case, the defect management apparatus 42 may function as a memory controller that records, if the NVM location 44 satisfies an open circuit condition, open circuit information associated with the NVM location 44. Recording the open circuit information may include, for example, updating an AIT (not shown) to indicate that a page containing the NVM location is open circuit protected and storing open circuit bit locations to the defect map 52, which may reside in the NVM device 74 or elsewhere in the system 60.

The defect management apparatus 42 may also conduct, during the write of the codeword to the NVM location 44, a shift of one or more bits to avoid open circuits in the NVM location 44. Moreover, the apparatus 42 may puncture the end of the parity portion of the codeword by an amount of the shift, wherein the end of the parity portion includes a last circulant of the codeword.

When a request to perform a read of the codeword from the NVM location 44 is received, the apparatus 42 may retrieve open circuit bit locations from the defect map 52 if the AIT indicates that the page containing the NVM location is open circuit protected. In such a case, the apparatus 42 may drop the open circuit bit locations during the read of the codeword from the NVM location by adding one or more erasures to the end of the result of the read.

ADDITIONAL NOTES AND EXAMPLES

Example 1 may include a defect management apparatus comprising an open circuit tracker to initiate a pre-read from a non-volatile memory (NVM) location in response to a request to perform a write of a codeword to the NVM location, determine whether the NVM location satisfies an open circuit condition based on the pre-read, and record, if the NVM location satisfies the open circuit condition, open circuit information associated with the NVM location, an encoder communicatively coupled to the open circuit tracker, the encoder to conduct, during the write of the codeword to the NVM location, a shift of one or more bits to avoid open circuits in the NVM location, wherein the encoder is to write the codeword to the NVM location without conducting the shift if the NVM location does not satisfy the open circuit condition, and a length adjuster communicatively coupled to the open circuit tracker, the length adjuster to puncture an end of a parity portion of the codeword by an amount of the shift, wherein the end of the parity portion is to include a last circulant of the codeword.

Example 2 may include the apparatus of Example 1, wherein the open circuit tracker is to update an address indirection table to indicate that a page containing the NVM location is open circuit protected and store open circuit bit locations to a defect map.

Example 3 may include the apparatus of Example 1, further including a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

Example 4 may include the apparatus of any one of Examples 1 to 3, wherein the decoder is to add one or more erasures to an end of a result of the read.

Example 5 may include a memory-based computing system comprising a memory device including a non-volatile memory (NVM) location, a data source to issue a request to write a codeword to the NVM location, and a memory controller communicatively coupled to the memory device, the memory controller including an open circuit tracker to record, if the NVM location satisfies an open circuit condition, open circuit information associated with the NVM location, an encoder communicatively coupled to the open circuit tracker, the encoder to conduct, during the write of the codeword to the NVM location, a shift of one or more bits to avoid open circuits in the NVM location, and a length adjuster communicatively coupled to the open circuit tracker, the length adjuster to puncture an end of a parity portion of the codeword by an amount of the shift.

Example 6 may include the system of Example 5, wherein the end of the parity portion is to include a last circulant of the codeword.

Example 7 may include the system of Example 5, further including first storage including an address indirection table, and second storage including a defect map, wherein the open circuit tracker is to update the address indirection table to indicate that a page containing the NVM location is open circuit protected and store open circuit bit locations to the defect map.

Example 8 may include the system of Example 5, wherein the open circuit tracker is to initiate a pre-read from the NVM location in response to the request to perform the write of the codeword and determine whether the NVM location satisfies the open circuit condition based on the pre-read.

Example 9 may include the system of Example 5, wherein the encoder is to write the codeword to the NVM location without conducting the shift if the NVM location does not satisfy the open circuit condition.

Example 10 may include the system of any one of Examples 5 to 9, wherein the memory controller further includes a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

Example 11 may include the system of Example 10, wherein the decoder is to add one or more erasures to an end of a result of the read.

Example 12 may include a defect management apparatus comprising an open circuit tracker to record, if a non-volatile memory (NVM) location satisfies an open circuit condition, open circuit information associated with the NVM location, an encoder communicatively coupled to the open circuit tracker, the encoder to conduct, during a write of a codeword to the NVM location, a shift of one or more bits to avoid open circuits in the NVM location, and a length adjuster communicatively coupled to the open circuit tracker, the length adjuster to puncture an end of a parity portion of the codeword by an amount of the shift.

Example 13 may include the apparatus of Example 12, wherein the end of the parity portion is to include a last circulant of the codeword.

Example 14 may include the apparatus of Example 12, wherein the open circuit tracker is to update an address indirection table to indicate that a page containing the NVM location is open circuit protected and store open circuit bit locations to a defect map.

Example 15 may include the apparatus of Example 12, wherein the open circuit tracker is to initiate a pre-read from the NVM location in response to a request to perform the write of the codeword and determine whether the NVM location satisfies the open circuit condition based on the pre-read.

Example 16 may include the apparatus of Example 12, further wherein the encoder is to write the codeword to the NVM location without conducting the shift if the NVM location does not satisfy the open circuit condition.

Example 17 may include the apparatus of any one of Examples 12 to 16, further including a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

Example 18 may include the apparatus of Example 17, wherein the decoder is to add one or more erasures to an end of a result of the read.

Example 19 may include a method of operating a defect management apparatus, comprising recording, if a non-volatile memory (NVM) location satisfies an open circuit condition, open circuit location information associated with the NVM location, conducting, during a write of a codeword to the NVM location, a shift of one or more bits to avoid open circuits in the NVM location, and puncturing an end of a parity portion of the codeword by an amount of the shift.

Example 20 may include the method of Example 19, wherein the end of the parity portion includes a last circulant of the codeword.

Example 21 may include the method of Example 19, wherein recording the open circuit location information includes updating an address indirection table to indicate that a page containing the NVM location is open circuit protected, and storing open circuit bit locations to a defect map.

Example 22 may include the method of Example 19, further including initiating a pre-read from the NVM location in response to a request to perform the write of the codeword, and determining whether the NVM location satisfies the open circuit condition based on the pre-read.

Example 23 may include the method of Example 19, further including writing the codeword to the NVM location without conducting the shift if the NVM location does not satisfy the open circuit condition.

Example 24 may include the method of any one of Examples 19 to 23, further including detecting a request to perform a read of the codeword from the NVM location, retrieving open circuit bit locations from a defect map if an address indirection table indicates that a page containing the NVM location is open circuit protected, and dropping the open circuit bit locations during the read of the codeword from the NVM location.

Example 25 may include the method of Example 24, further including adding one or more erasures to an end of a result of the read.

Example 26 may include a defect management apparatus comprising means for recording, if a non-volatile memory (NVM) location satisfies an open circuit condition, open circuit location information associated with the NVM location, means for conducting, during a write of a codeword to the NVM location, a shift of one or more bits to avoid open circuits in the NVM location, and means for puncturing an end of a parity portion of the codeword by an amount of the shift.

Example 27 may include the apparatus of Example 26, wherein the end of the parity portion is to include a last circulant of the codeword.

Example 28 may include the apparatus of Example 26, wherein the means for recording the open circuit location information includes means for updating an address indirection table to indicate that a page containing the NVM location is open circuit protected, and means for storing open circuit bit locations to a defect map.

Example 29 may include the apparatus of Example 26, further including means for initiating a pre-read from the NVM location in response to a request to perform the write of the codeword, and means for determining whether the NVM location satisfies the open circuit condition based on the pre-read.

Example 30 may include the apparatus of Example 26, further including means for writing the codeword to the NVM location without conducting the shift if the NVM location does not satisfy the open circuit condition.

Example 31 may include the apparatus of any one of Examples 26 to 30, further including means for detecting a request to perform a read of the codeword from the NVM location, means for retrieving open circuit bit locations from a defect map if an address indirection table indicates that a page containing the NVM location is open circuit protected, and means for dropping the open circuit bit locations during the read of the codeword from the NVM location.

Example 32 may include the apparatus of Example 31, further including means for adding one or more erasures to an end of a result of the read.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

I claim:

1. An apparatus comprising:
an open circuit tracker to initiate a pre-read from a non-volatile memory (NVM) location in response to a request to perform a write of a codeword to the NVM location, determine whether the NVM location satisfies an open circuit condition based on the pre-read, and record, if the NVM location satisfies the open circuit condition, open circuit information associated with the NVM location;
an encoder communicatively coupled to the open circuit tracker, the encoder to conduct, during the write of the codeword to the NVM location, a shift of one or more bits to avoid open circuits in the NVM location, wherein the encoder is to write the codeword to the NVM location without conducting the shift if the NVM location does not satisfy the open circuit condition; and
a length adjuster communicatively coupled to the open circuit tracker, the length adjuster to puncture an end of a parity portion of the codeword by an amount of the shift, wherein the end of the parity portion is to include a last circulant of the codeword.

2. The apparatus of claim 1, wherein the open circuit tracker is to update an address indirection table to indicate that a page containing the NVM location is open circuit protected and store open circuit bit locations to a defect map.

3. The apparatus of claim 1, further including a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

4. The apparatus of claim 3, wherein the decoder is to add one or more erasures to an end of a result of the read.

5. A system comprising:
a memory device including a non-volatile memory (NVM) location;
a data source to issue a request to write a codeword to the NVM location; and
a memory controller communicatively coupled to the memory device, the memory controller including,
an open circuit tracker to record, if the NVM location satisfies an open circuit condition, open circuit information associated with the NVM location,
an encoder communicatively coupled to the open circuit tracker, the encoder to conduct, during the write of the codeword to the NVM location, a shift of one or more bits to avoid open circuits in the NVM location, and
a length adjuster communicatively coupled to the open circuit tracker, the length adjuster to puncture an end of a parity portion of the codeword by an amount of the shift.

6. The system of claim 5, wherein the end of the parity portion is to include a last circulant of the codeword.

7. The system of claim 5, further including:
first storage including an address indirection table; and
second storage including a defect map, wherein the open circuit tracker is to update the address indirection table to indicate that a page containing the NVM location is open circuit protected and store open circuit bit locations to the defect map.

8. The system of claim 5, wherein the open circuit tracker is to initiate a pre-read from the NVM location in response to the request to perform the write of the codeword and determine whether the NVM location satisfies the open circuit condition based on the pre-read.

9. The system of claim 5, wherein the encoder is to write the codeword to the NVM location without conducting the shift if the NVM location does not satisfy the open circuit condition.

10. The system of claim 5, wherein the memory controller further includes a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

11. The system of claim 10, wherein the decoder is to add one or more erasures to an end of a result of the read.

12. An apparatus comprising:
an open circuit tracker to record, if a non-volatile memory (NVM) location satisfies an open circuit condition, open circuit information associated with the NVM location;
an encoder communicatively coupled to the open circuit tracker, the encoder to conduct, during a write of a codeword to the NVM location, a shift of one or more bits to avoid open circuits in the NVM location; and
a length adjuster communicatively coupled to the open circuit tracker, the length adjuster to puncture an end of a parity portion of the codeword by an amount of the shift.

13. The apparatus of claim 12, wherein the end of the parity portion is to include a last circulant of the codeword.

14. The apparatus of claim 12, wherein the open circuit tracker is to update an address indirection table to indicate that a page containing the NVM location is open circuit protected and store open circuit bit locations to a defect map.

15. The apparatus of claim 12, wherein the open circuit tracker is to initiate a pre-read from the NVM location in response to a request to perform the write of the codeword and determine whether the NVM location satisfies the open circuit condition based on the pre-read.

16. The apparatus of claim 12, further wherein the encoder is to write the codeword to the NVM location without conducting the shift if the NVM location does not satisfy the open circuit condition.

17. The apparatus of claim 12, further including a decoder to detect a request to perform a read of the codeword from the NVM location, retrieve open circuit bit locations from a defect map if an address indirection table indicates that a page containing the NVM location is open circuit protected, and drop the open circuit bit locations during the read of the codeword from the NVM location.

18. The apparatus of claim 17, wherein the decoder is to add one or more erasures to an end of a result of the read.

19. A method comprising:
    recording, if a non-volatile memory (NVM) location satisfies an open circuit condition, open circuit location information associated with the NVM location;
    conducting, during a write of a codeword to the NVM location, a shift of one or more bits to avoid open circuits in the NVM location; and
    puncturing an end of a parity portion of the codeword by an amount of the shift.

20. The method of claim 19, wherein the end of the parity portion includes a last circulant of the codeword.

21. The method of claim 19, wherein recording the open circuit location information includes:
    updating an address indirection table to indicate that a page containing the NVM location is open circuit protected; and
    storing open circuit bit locations to a defect map.

22. The method of claim 19, further including:
    initiating a pre-read from the NVM location in response to a request to perform the write of the codeword; and
    determining whether the NVM location satisfies the open circuit condition based on the pre-read.

23. The method of claim 19, further including writing the codeword to the NVM location without conducting the shift if the NVM location does not satisfy the open circuit condition.

24. The method of claim 19, further including:
    detecting a request to perform a read of the codeword from the NVM location;
    retrieving open circuit bit locations from a defect map if an address indirection table indicates that a page containing the NVM location is open circuit protected; and
    dropping the open circuit bit locations during the read of the codeword from the NVM location.

25. The method of claim 24, further including adding one or more erasures to an end of a result of the read.

\* \* \* \* \*